United States Patent
Lee et al.

(10) Patent No.: US 6,508,952 B1
(45) Date of Patent: Jan. 21, 2003

(54) CHEMICAL MECHANICAL ABRASIVE COMPOSITION FOR USE IN SEMICONDUCTOR PROCESSING

(75) Inventors: Tsung-Ho Lee, Ping Tong Hsien (TW); Kang-Hua Lee, Kaohsiung (TW); Tsui-Ping Yeh, Kaohsiung (TW)

(73) Assignee: Eternal Chemical Co., Ltd. (TW)

( * ) Notice: Subject to any disclaimer, the term of this patent is extended or adjusted under 35 U.S.C. 154(b) by 0 days.

(21) Appl. No.: 09/457,243

(22) Filed: Dec. 8, 1999

(30) Foreign Application Priority Data

Jun. 16, 1999 (TW) .......................... 88110096 A

(51) Int. Cl.⁷ .................. C09K 13/00; C09K 13/04; C09K 13/06; H01L 21/302
(52) U.S. Cl. ............... 252/79.1; 252/79.2; 252/79.4; 438/692
(58) Field of Search ............... 252/79.1, 79.2, 252/79.4; 438/692

(56) References Cited

U.S. PATENT DOCUMENTS

| | | | |
|---|---|---|---|
| 4,959,113 A | 9/1990 | Roberts | 156/636 |
| 5,084,071 A | 1/1992 | Nenadic et al. | 51/309 |
| 5,114,437 A | 5/1992 | Takeuchi et al. | 51/293 |
| 5,209,816 A | 5/1993 | Yu et al. | 156/636 |
| 5,225,034 A | 7/1993 | Yu et al. | 156/636 |
| 5,340,370 A | 8/1994 | Cadien et al. | 51/308 |
| 5,366,542 A | 11/1994 | Yamada et al. | 156/636 |
| 5,391,258 A | 2/1995 | Brancaleoni et al. | 156/636 |
| 5,516,346 A | 5/1996 | Cadien et al. | 51/308 |
| 5,759,917 A * | 6/1998 | Grover et al. | 438/690 |
| 5,770,095 A * | 6/1998 | Sasaki et al. | 216/38 |
| 5,783,489 A * | 7/1998 | Kaufman et al. | 438/692 |
| 5,958,288 A | 9/1999 | Mueller et al. | 252/186.1 |
| 5,980,775 A | 11/1999 | Grumbine et al. | 252/79.1 |
| 6,015,506 A | 1/2000 | Streinz et al. | 252/186.1 |
| 6,063,306 A * | 5/2000 | Kaufman et al. | 252/79.4 |
| 6,068,787 A | 5/2000 | Grunbine et al. | 252/79.1 |
| 6,083,419 A | 7/2000 | Grumbine et al. | 252/79.1 |
| 6,217,416 B1 * | 4/2001 | Kaufman et al. | 451/41 |
| 6,303,049 B1 * | 10/2001 | Lee et al. | 252/79.1 |

FOREIGN PATENT DOCUMENTS

| | | | |
|---|---|---|---|
| EP | 846741 A1 | 6/1998 | |
| GB | 0844290 A1 * | 5/1998 | C09G/1/02 |
| JP | 11080708 | 3/1999 | C09K/3/14 |
| WO | WO 96/16436 | 5/1996 | H01L/21/3105 |

OTHER PUBLICATIONS

Derwent Abstracts Accession No. 98–412312/35. Tsay et al. Polishing Solution for Chemical Mechanical Polishing Containing . . . Metal Layer. (Abstract of TW 326055–A).

* cited by examiner

*Primary Examiner*—Robert Kunemund
*Assistant Examiner*—Lynette T. Umez-Eronini
(74) *Attorney, Agent, or Firm*—Scully, Scott, Murphy & Presser

(57) ABSTRACT

The invention provides a chemical mechanical abrasive composition for use in semiconductor processing, which comprises phosphorous acid and/or a salt thereof as an abrasive enhancer. The chemical mechanical abrasive composition of the invention can be in the form of a slurry which comprises 70–99.5% by weight of an aqueous medium, 0.1–25% by weight of an abrasive, and 0.01–2% by weight of said abrasion enhancer. The chemical mechanical abrasive composition of the invention may further comprise an abrasion co-enhancer selected from an amino acid, a salt thereof, a carboxylic acid, a salt thereof, or a mixture of the acids and/or salts.

6 Claims, No Drawings

CHEMICAL MECHANICAL ABRASIVE COMPOSITION FOR USE IN SEMICONDUCTOR PROCESSING

BACKGROUND OF THE INVENTION

1. Field of the Invention

The invention pertains to a chemical mechanical abrasive composition. The chemical mechanical abrasive composition is useful in polishing the surface of a semiconductor wafer.

2. Description of the Prior Art

Chemical mechanical polishing (CMP) is a planarization technique which was developed to address the problem associated with the difficulty in focus during a photolithography process for producing integrated circuits owing to the difference in the height of deposited films. Chemical mechanical polishing technique was first applied to the production of the elements with a size in the order of 0.5 microns. With the reduction in the size of elements, the chemical mechanical polishing technique was applicable to an increased number of layers. Until the elements were developed to the order of 0.25 microns, the chemical mechanical polishing became a main and essential planarization technique. In general, the polishing method for producing a wire circuit comprises mounting a semiconductor wafer on a spinning platen equipped with an abrasive head and applying an abrasive slurry comprising abrasive particles and an oxidant to the surface of the wafer to enhance the abrasion efficacy.

U.S. Pat. No. 5,225,034 discloses a chemical mechanical abrasive slurry which comprises $AgNO_3$, solid abrasive particles, and an oxidant selected from $H_2O_2$, HOCl, KOCl, $KMgO_4$, or $CH_3COOOH$. The slurry is used for polishing a copper layer on a semiconductor wafer so as to produce a copper wire on the wafer.

U.S. Pat. No. 5,209,816 discloses a method for polishing an Al- or Ti-containing metal layer with a chemical mechanical abrasive slurry. The abrasive slurry contains, in addition to a solid abrasive material, about 0.1–20% by volume of $H_3PO_4$ and about 1–30% by volume of $H_2O_2$.

U.S. Pat. No. 4,959,113 discloses a method of using an aqueous abrasive composition for polishing metal surfaces. The aqueous abrasive composition comprises water, an abrasive, e.g. $CeO_2$, $Al_2O_3$, $ZrO_2$, $TiO_2$, $SiO_2$, SiC, $SnO_2$, or TiC, and a salt including a metal cation of Group IIA, IIIA, IVA or IVB and an anion of chloride, bromide, iodide, nitrate, sulfate, phosphate or perchlorate. This patent also discloses the use of hydrochloric acid, nitric acid, phosphoric acid or sulfuric acid to adjust the pH of the abrasive composition to be in the range of 1 to 6.

U.S. Pat. No. 5,391,258 discloses an abrasive composition for polishing silicon, silica or silicate composite. The abrasive composition comprises, in addition to abrasive particles, hydrogen peroxide and potassium hydrogen phthalate.

U.S. Pat. No. 5,114,437 discloses a polishing composition for an aluminum substrate comprising an alumina polishing agent having an average particle size of 0.2 to 5 µm, and a polishing accelerator selected from the group consisting of chromium(III) nitrate, lanthanum nitrate, ammonium cerium (III) nitrate, and neodymium nitrate.

U.S. Pat. No. 5,084,071 discloses a chemical mechanical polishing slurry for an electronic component substrate. The polishing slurry comprises no more than 1 weight percent of alumina, abrasive particles (e.g. $SiO_2$, $CeO_2$, SiC, $Si_3N_4$, or $Fe_2O_3$ particles), a transition metal chelated salt (e.g. ammonium iron EDTA) for use as a polishing accelerator, and a solvent for said salt.

U.S. Pat. No. 5,336,542 discloses a polishing composition comprising alumina abrasive particles and a chelating agent selected from the group consisting of polyaminocarboxylic acid (e.g. EDTA) and sodium and potassium salts thereof The composition may further comprise beohmit or an aluminum salt.

U.S. Pat. No. 5,340,370 discloses a chemical mechanical polishing slurry for tungsten or tungsten nitride film, which comprises an oxidizing agent such as potassium ferricyanide, an abrasive, and water, and has a pH between 2 and 4.

U.S. Pat. No. 5,516,346 discloses a slurry for chemical mechanically polishing a titanium film, said slurry comprising potassium fluoride in a concentration sufficient to complex said titanium film and an abrasive such as silica, and having a pH less than eight.

WO 96/16436 discloses a chemical mechanical polishing slurry which comprises abrasive particles having a median particle diameter less than 0.400 microns, a ferric salt oxidant, and an aqueous surfactant suspension of a mixture of propyleneglycol and methylparaben.

In semiconductor processing, need still exists for abrasive compositions which are more economical and have high polishing performance.

SUMMARY OF THE INVENTION

The invention provides a chemical mechanical abrasive composition for use in semiconductor processing, which comprises phosphorous acid and/or a salt thereof as an abrasion enhancer. The chemical mechanical abrasive composition of the invention can be in the form of a slurry which comprises 70–99.5% by weight of an aqueous medium, 0.1–25% by weight of an abrasive, and 0.01–2% by weight of the said abrasion enhancer. The chemical mechanical abrasive composition of the invention may further comprise an abrasion co-enhancer selected from an amino acid, a salt thereof, a carboxylic acid, a salt thereof, or a mixture of the acids and/or salts.

DETAILED DESCRIPTION OF THE INVENTION

The invention provides a chemical mechanical abrasive composition for use in semiconductor processing, which comprises phosphorous acid and/or a salt thereof as an abrasion enhancer. The chemical mechanical abrasive composition of the invention can be in the form of a slurry which comprises 70–99.5% by weight of an aqueous medium, 0.1–25% by weight, preferably 0.5–15% by weight, more preferably 0.5–8% by weight of an abrasive, and 0.01–2% by weight, preferably 0.03–1% by weight, and more preferably 0.03–0.5% by weight of the said abrasion enhancer. The chemical mechanical abrasive composition of the invention may further comprise an abrasion co-enhancer selected from an amino acid, a salt thereof, a carboxylic acid, a salt, thereof, or a mixture of the acids and/or salts.

If phosphorous acid is added to an abrasive slurry, the abrasion rate achieved by the abrasive slurry can be enhanced. Moreover, if the abrasive slurry further comprises an amino acid or a carboxylic acid, the abrasion rate achieved by the abrasive slurry can be further enhanced. However, it has been found that if only an amino acid or a carboxylic acid is added to an abrasive slurry, the abrasion rate achieved by the abrasive slurry cannot be enhanced. Furthermore, it can be known from the examples hereinafter that phosphorous acid has a better abrasion performance than does phosphoric acid have.

The abrasive used in the abrasive composition of the invention can be any commercially available abrasive agent in particle form, such as $SiO_2$, $Al_2O_3$, $ZrO_2$, $CeO_2$, SiC, $Fe_2O_3$, $TiO_2$, $Si_3N_4$, or a mixture thereof. These abrasive particles normally have a high purity, a high surface area, and a narrow particle size distribution, and thus are suitable for use in abrasive compositions as abrasive agents.

The amino acid or carboxylic acid used in the present invention can be any commercially available one, such as glycine, creatine, alanine, formic acid, acetic acid, propionic acid, butyric acid, valeric acid, hexanoic acid, malonic acid, glutaric acid, adipic acid, citric acid, malic acid, tartaric acid, or oxalic acid.

The chemical mechanical abrasive composition of the present invention may use water as a medium. In the preparation of the abrasive composition, water, and preferably conventional deionized water, may be used to make the abrasive composition into a slurry.

The chemical mechanical abrasive composition of the present invention may further comprise other ingredients which are conventionally used in chemical mechanical abrasive compositions, only if they do not cause any adverse effect on the abrasive composition of the present invention. Therefore, the chemical mechanical abrasive composition of the present invention may optionally comprise an oxidant conventionally used in the art, or for example, in a copper production process, the abrasive composition of the present invention may include benzotriazole and/or its derivatives to protect copper from rapid corrosion.

The abrasive composition of the present invention can be prepared by any conventional method. For example, an abrasive slurry can be prepared by first adding abrasive particles to water and continuously stirring the mixture with a high shear force until the abrasive particles are completely suspended in water. Thereafter, an additional amount of water is added to the slurry such that the abrasive particles in the slurry are present in the desired solid content. For example, if an abrasive slurry prepared according to the invention contains 70–99.5% by weight of deionized water, the solid content of the s range from 0.5 to 25% by weight, preferably 0.5 to 15% by weight, and more preferably 0.5 to 8% by weight. The additives described above are then introduced into the resultant slurry and the pH of the slurry is adjusted by a base to be in the desired range. For example, when the metal film to be polished is Cu or TaN film, the pH may be adjusted to be in the range of 2.5 to 7.

The present invention will be further described by, but not limited to, the following examples. Any modifications or changes with reference to the present invention which can be easily accomplished by persons skilled in the art will be covered in the domain of the present invention.

EXAMPLES

Abrasion Test

A. Apparatus: IPEC/Westech 472
B. Conditions: Pressure: 5 psi
   Back pressure: 1.5 psi
   Temperature: 25° C.
   Spindle speed: 55 rpm
   Platen speed: 50 rpm
   Pad type: IC 1400
   Slurry flow: 150 ml/min
C. Wafer: Cu film and TaN film: commercially available from Silicon Valley Microelectronics, Inc., which is obtained by PVD-depositing a Cu film and a TaN film having a thickness of 0.85±5% micrometers on a 6 inches silicon wafer
D. Slurry: Prepared by mixing each of the slurries of the following examples with 30% $H_2O_2$ at a volume ratio of 9:1, and uniformly agitating the resultant mixtures Abrasion Test Procedure Both before and after an abrasion test, the thickness of the wafer to be polished should be measured by a thickness measuring means. The sheet resistivity of the metal film is measured by a 4-point probe. The thickness of the film is determined by the following equation:

$$T \times R = \text{resistivity coefficient}$$

wherein T represents film thickness (Å), and R represents sheet resistivity ($\Omega/cm^2$). For various metal films, the resistivity coefficient will be a constant.

The present invention used Model RS 75 of KLA-Tencor Company to determine the metal film thickness. The abrasion rate is determined as follows:

A metal film thickness $T_1$, is first determined by the above apparatus of Model RS75. The film is polished by an exemplified slurry under the above-mentioned conditions for 1 minute. Thereafter, the wafer is cleaned by Evergreen Model 10X commercially available from the Solid State Equipment Corporation. After spray-drying the wafer, a metal film thickness $T_2$ is measured by the apparatus of Model RS75. The abrasion rate of the metal film for the exemplified slurry is represented by $T_1-T_2$.

Example 1

An abrasive slurry was prepared by using fumed silica as the abrasive. The resultant slurry has the following constitution:

fumed silica: 8.0% by weight;

phosphorous acid: 0.2% by weight;

benzotriazole: 0.1% by weight; and a base to adjust the pH and deionized water: the balance.

The results of abrasion test for the resultant slurry are listed in Table 1.

Example 2

An abrasive slurry having the following constitution was prepared in a manner similar to that described in Example 1:

fumed silica: 8.0% by weight;

glycine: 0.2% by weight;

benzotriazole: 0.1% by weight; and a base to adjust the pH and deionized water: the balance.

The results of abrasion test for the resultant slurry are listed in Table 1.

Example 3

An abrasive slurry having the following constitution was prepared in a manner similar to that described in Example 1:

fumed silica: 8.0% by weight;

adipic acid: 0.2% by weight;

benzotriazole: 0.1% by weight; and a base to adjust the pH and deionized water: the balance.

The results of abrasion test for the resultant slurry are listed in Table 1.

Example 4

An abrasive slurry having the following constitution was prepared in a manner similar to that described in Example 1:

fumed silica: 8.0% by weight;

phosphorous acid: 0.2% by weight;

glycine: 0.2% by weight;

benzotriazole: 0.1% by weight; and a base to adjust the pH and deionized water: the balance.

The results of abrasion test for the resultant slurry are listed in Table 1.

Example 5

An abrasive slurry having the following constitution was prepared in a manner similar to that described in Example 1:

fumed silica: 8.0% by weight;

phosphorous acid: 0.2% by weight;

adipic acid: 0.2% by weight;

benzotriazole: 0.1% by weight; and a base to adjust the pH and deionized water: the balance.

The results of abrasion test for the resultant slurry are listed in Table 1.

Example 6

An abrasive slurry having the following constitution was prepared in a manner similar to that described in Example 1:

fumed silica: 8.0% by weight;

phosphorous acid: 0.2% by weight;

formic acid: 0.2% by weight;

benzotriazole: 0.1% by weight; and a base to adjust the pH and deionized water: the balance.

The results of abrasion test for the resultant slurry are listed in Table 1.

Example 7

An abrasive slurry was prepared by using colloidal silica as the abrasive. The resultant slurry has the following constitution:

colloidal silica: 12.0% by weight;

phosphorous acid: 0.2% by weight;

adipic acid: 0.2% by weight;

benzotriazole: 0.1% by weight; and a base to adjust the pH and deionized water: the balance.

The results of abrasion test for the resultant slurry are listed in Table 1.

Example 8

An abrasive slurry was prepared by using fumed alumina as the abrasive. The resultant slurry has the following constitution:

fumed alumina: 8.0% by weight;

phosphorous acid: 0.2% by weight;

benzotriazole: 0.1% by weight; and a base to adjust the pH and deionized water: the balance.

The results of abrasion test for the resultant slurry are listed in Table 1.

Example 9

An abrasive slurry having the following constitution was prepared in a manner similar to that described in Example 8:

fumed alumina: 8.0% by weight;

glycine: 0.2% by weight;

benzotriazole: 0.1% by weight; and a base to adjust the pH and deionized water: the balance.

The results of abrasion test for the resultant slurry are listed in Table 1.

Example 10

An abrasive slurry having the following constitution was prepared in a manner similar to that described in Example 1:

fumed silica: 8.0% by weight;

phosphoric acid: 0.2% by weight;

glycine: 0.2% by weight;

benzotriazole: 0.1% by weight; and a base to adjust the pH and deionized water: the balance.

The results of abrasion test for the resultant slurry are listed in Table 1.

Example 11

An abrasive slurry having the following constitution was prepared in a manner similar to that described in Example 1:

fumed silica: 8.0% by weight;

phosphoric acid: 0.2% by weight;

adipic acid: 0.2% by weight;

benzotriazole: 0.1% by weight; and a base to adjust the pH and deionized water: the balance.

The results of abrasion test for the resultant slurry are listed in Table 1.

TABLE 1

| abrasive slurry | abrasive particle | solid content (wt. %)* | abrasion enhancer and its content (wt. %)* | | pH | Cu-film removal rate (Å/min) | TaN-film removal rate (Å/min) | SiO$_2$-film removal rate (Å/min) |
|---|---|---|---|---|---|---|---|---|
| Example 1 | fumed silica | 8 | phosphorous acid benzotriazole | 0.2 0.1 | 2.5~3.0 | 3175 | 1076 | 49 |
| Example 2 | fumed silica | 8 | glycine benzotriazole | 0.2 0.1 | 2.5~3.0 | 918 | 940 | 45 |
| Example 3 | fumed silica | 8 | adipic acid benzotriazole | 0.2 0.1 | 2.5~3.0 | 925 | 959 | 39 |
| Example 4 | fumed silica | 8 | phosphorous acid glycine benzotriazole | 0.2 0.2 0.1 | 2.5~3.0 | 5197 | 1217 | 52 |

TABLE 1-continued

| abrasive slurry | abrasive particle | solid content (wt. %)* | abrasion enhancer and its content (wt. %)* | | pH | Cu-film removal rate (Å/min) | TaN-film removal rate (Å/min) | SiO$_2$-film removal rate (Å/min) |
|---|---|---|---|---|---|---|---|---|
| Example 5 | fumed silica | 8 | phosphorous acid<br>adipic acid<br>benzotriazole | 0.2<br>0.2<br>0.1 | 2.5~3.0 | 6002 | 1217 | 47 |
| Example 6 | fumed silica | 8 | phosphorous acid<br>formic acid<br>benzotriazole | 0.2<br>0.2<br>0.1 | 2.5~3.0 | 7524 | 1390 | 148 |
| Example 7 | colloidal silica | 12 | phosphorous acid<br>adipic acid<br>benzotriazole | 0.2<br>0.2<br>0.1 | 5.0~5.5 | 6867 | 1877 | 1398 |
| Example 8 | fumed alumina | 8 | phosphorous acid<br>benzotriazole | 0.2<br>0.1 | 2.5~3.0 | 4414 | 565 | 177 |
| Example 9 | fumed alumina | 8 | glycine<br>benzotriazole | 0.2<br>0.1 | 2.5~3.0 | 977 | 584 | 119 |
| Example 10 | fumed silica | 8 | phosphoric acid<br>glycine<br>benzotriazole | 0.2<br>0.2<br>0.1 | 2.5~3.0 | 3066 | 922 | 419 |
| Example 11 | fumed silica | 8 | phosphoric acid<br>adipic acid<br>benzotriazole | 0.2<br>0.2<br>0.1 | 2.5~3.0 | 3435 | 938 | 425 |

*weight percent

We claim:

1. A chemical mechanical abrasive slurry for use in semiconductor processing which consists essentially of an abrasive, an aqueous medium, an abrasion enhancer which is phosphorous acid and/or a salt thereof, an oxidant and a triazole compound.

2. A slurry according to claim 1 wherein said aqueous medium is present in a concentration of 70 to 99.5% by weight; said abrasive is present in a concentration of 0.1 to 25% by weight; and said abrasive enhancer is present in a concentration of 0.01 to 2% by weight.

3. A slurry according to claim 2 wherein said abrasive is selected from the group consisting of SiO$_2$, Al$_2$O$_3$, ZrO$_2$, CeO$_2$, SiC, Fe$_2$O$_3$, TiO$_2$, Si$_3$N$_4$ and mixtures thereof.

4. A chemical mechanical abrasive slurry for use in semiconductor processing which consists essentially of an abrasive, a aqueous medium, an abrasion enhancer which is phosphorous acid and/or a salt thereof, an abrasion co-enhancer selected from the group consisting of an amino acid, a salt thereof, a carboxylic acid, a salt thereof and mixtures thereof, an oxidant and a triazole compound.

5. A slurry according to claim 4 wherein said amino acid is selected from the group consisting of glycine, creatine and alanine.

6. A slurry according to claim 4 wherein said carboxylic acid is selected from the group consisting of formic acid, acetic acid, propionic acid, butyric acid, valeric acid, hexanoic acid, malonic acid, glutaric acid, adipic acid, citric acid, malic acid, tartaric acid and oxalic acid.

* * * * *